(12) United States Patent
Fitch et al.

(10) Patent No.: US 11,402,336 B1
(45) Date of Patent: Aug. 2, 2022

(54) REFLECTED ENERGY DETECTION SYSTEM AND METHOD FOR DETECTING OILY RESIDUE IN TWO-PHASE IMMERSION COOLING SYSTEMS

(71) Applicant: Dell Products L.P., Round Rock, TX (US)

(72) Inventors: Jon Taylor Fitch, Austin, TX (US); Steven Embleton, Austin, TX (US); David Lyle Moss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/168,896

(22) Filed: Feb. 5, 2021

(51) Int. Cl.
*G01N 21/90* (2006.01)
*H05K 7/20* (2006.01)

(52) U.S. Cl.
CPC ....... *G01N 21/9072* (2013.01); *G01N 21/909* (2013.01); *H05K 7/20236* (2013.01)

(58) Field of Classification Search
CPC ....... G01N 21/6428; G01N 2021/6439; G01N 2015/1006; G01N 15/1459; G01N 33/5005; G01N 2015/149; G01N 2015/065; G01N 33/48; G01N 15/1404; G01N 15/1468; G01N 15/147; G01N 2015/1406; G01N 2015/1415; G01N 21/63; G01N 21/8851; G01N 21/53; G01N 21/3504; G01N 21/31;
(Continued)

(56) References Cited

U.S. PATENT DOCUMENTS

| | | | |
|---|---|---|---|
| 7,362,448 B1 * | 4/2008 | Liu | G01B 11/0625 356/504 |
| 9,921,622 B2 | 3/2018 | Shelnutt et al. | |

(Continued)

FOREIGN PATENT DOCUMENTS

| | | | | |
|---|---|---|---|---|
| JP | 2003247812 A | * | 9/2003 | F16C 17/24 |
| KR | 20140140039 A | * | 12/2014 | |

(Continued)

OTHER PUBLICATIONS

P. E. Tuma, "Design considerations relating to non-thermal aspects of passive 2-phase immersion cooling," *2011 27th Annual IEEE Semiconductor Thermal Measurement and Management Symposium*, San Jose, CA, 2011, pp. 1-9.
(Continued)

*Primary Examiner* — Michael P Stafira
(74) *Attorney, Agent, or Firm* — Baker Botts L.L.P.

(57) ABSTRACT

A system for detecting residue in a two-phase immersion cooling system based on changes in the intensity of energy reflected off a reflective surface. An energy source is positioned at an incident angle relative to a reflective surface and an intensity sensor is positioned at a target reflected energy angle relative to the reflective surface, wherein the intensity sensor detects light or other energy reflected off the reflective surface. If residues are deposited on the reflective surface, the reflectivity of the residue will change the reflected energy angle or otherwise change the amount of energy reflected toward the sensor. A heating element may generate more heat than existing components such that the system detects the presence of residues with sufficient time to allow less expensive and less intensive corrective measures.

18 Claims, 3 Drawing Sheets

(58) Field of Classification Search
CPC .......... G01N 21/6456; G01N 21/05; G01N 21/6452; G01N 15/1429; G01N 2015/1075; G01N 15/06; G01N 2015/0693; G01N 21/76; G01N 2015/1477; G01N 21/648; G01N 35/1002; G01N 21/51; G01N 15/1427; G01N 15/1475; G01N 2015/1087; G01N 2015/144; G01N 2015/1445; G01N 2015/1452; G01N 2015/1472; G01N 2015/1493; G01N 2015/1497; G01N 21/9027; G01N 21/94; G01N 15/1463; G01N 35/025; G01N 2021/6441; G01N 2021/1765; G01N 2021/6419; G01N 2035/00356; G01N 2021/1793; G01N 2021/6417; G01N 21/274; G01N 21/6445; G01N 35/0098; G01N 21/45; G01N 21/9501; G01N 15/00; G01N 15/0656; G01N 21/17; G01N 21/532; G01N 21/8483; G01N 33/15; G01N 21/8806; G01N 35/04; G01N 2021/3595; G01N 21/359; G01N 21/85; G01N 33/54386; G01N 35/1079; G01N 35/026; G01N 2021/8416; G01N 2035/00435; G01N 21/031; G01N 2500/00; G01N 33/582; G01N 2021/058; G01N 2021/6421; G01N 21/3577; G01N 23/225; G01N 35/0099; G01N 35/08; G01N 35/1011; G01N 35/1065; G01N 2021/6432; G01N 2035/00346; G01N 2035/103; G01N 21/09; G01N 21/55; G01N 2201/0221; G01N 2035/0441; G01N 21/956; G01N 2201/0612; G01N 2333/471; G01N 2333/78; G01N 2800/36; G01N 2800/368; G01N 33/564; G01N 33/57476; G01N 33/6887; G01N 33/689; G01N 21/6454; G01N 25/72; G01N 33/54373; G01N 35/028; G01N 2035/00524; G01N 2035/0097; G01N 2035/0443; G01N 2035/0444; G01N 2035/0455; G01N 2035/0491; G01N 21/3563; G01N 21/645; G01N 21/7703; G01N 2201/0415; G01N 2201/06113; G01N 35/00693; G01N 35/0092; G01N 21/64; G01N 21/6486; G01N 21/88; G01N 21/952; G01N 21/39; G01N 2201/129; G01N 21/6458; G01N 2201/062; G01N 2201/0637; G01N 21/35; G01N 21/75; G01N 21/896; G01N 2201/08; G01N 2201/12; G01N 2021/1795; G01N 2021/8466; G01N 2035/0486; G01N 21/00; G01N 21/0303; G01N 21/553; G01N 23/2204; G01N 27/127; G01N 33/2841; G01N 2001/2244; G01N 2001/247; G01N 2021/3137; G01N 2021/399; G01N 21/255; G01N 21/272; G01N 21/69; G01N 21/78; G01N 2201/0627; G01N 2201/068; G01N 2201/10; G01N 2333/35; G01N 33/491; G01N 33/56911; G01N 33/5695; G01N 2021/3513; G01N 2021/8578; G01N 21/41; G01N 21/4738; G01N 21/8903; G01N 2201/061; G01N 2201/0633; G01N 2201/0697; G01N 33/5029; G01N 1/38; G01N 15/1436; G01N 2015/1486; G01N 2021/6478; G01N 2021/6491; G01N 2021/7773; G01N 2021/8592; G01N 2021/8887; G01N 2030/621; G01N 2030/746; G01N 2033/184; G01N 21/33; G01N 2201/0639; G01N 2201/0695; G01N 2201/121; G01N 30/74; G01N 33/5008; G01N 33/57492; G01N 33/588; G01N 15/1434; G01N 15/1484; G01N 2015/1081; G01N 2035/00158; G01N 21/21; G01N 21/65; G01N 2201/06146; G01N 2201/0621; G01N 2201/0635; G01N 2201/12723; G01N 2201/1293; G01N 2333/70596; G01N 33/0036; G01N 33/004; G01N 33/54346; G01N 33/553; G01N 2021/152; G01N 2021/4719; G01N 2021/4742; G01N 2021/772; G01N 2021/8472; G01N 2035/00306; G01N 21/253; G01N 21/474; G01N 21/84; G01N 2201/088; G01N 2201/101; G01N 33/225; G01N 33/49; G01N 33/50; G01N 33/533; G01N 35/00871; G01N 15/14; G01N 17/008; G01N 2021/4707; G01N 21/7743; G01N 2201/126; G01N 27/02; G01N 27/121; G01N 33/0031; G01N 33/54366; G01N 33/558; G01N 1/4077; G01N 2001/4083; G01N 2021/4709; G01N 2035/00316; G01N 2035/00366; G01N 2035/1032; G01N 21/783; G01N 21/89; G01N 33/02; G01N 33/551; G01N 35/1097; G01N 2001/005; G01N 2015/0088; G01N 2021/0339; G01N 2021/0346; G01N 2021/035; G01N 2021/1782; G01N 2021/391; G01N 2021/655; G01N 2021/8825; G01N 2021/8917; G01N 2021/9544; G01N 2035/00326; G01N 21/03; G01N 21/15; G01N 21/25; G01N 21/27; G01N 21/43; G01N 21/49; G01N 21/552; G01N 21/658; G01N 21/8422; G01N 21/8915; G01N 21/9054; G01N 21/954; G01N 21/95607; G01N 21/95692; G01N 2201/0438; G01N 2201/0461; G01N 2201/0636; G01N 27/048; G01N 27/223; G01N 29/04; G01N 29/0654; G01N 29/2418; G01N 29/30; G01N 33/5014; G01N 33/5047; G01N 33/505; G01N 33/543; G01N 1/2202; G01N 1/2208; G01N 1/2211; G01N 1/2813; G01N 1/42; G01N 1/44; G01N 15/0266; G01N 15/0606; G01N 15/1456; G01N 2001/2223; G01N 2001/383; G01N 2015/0038; G01N 2015/0096; G01N 2015/0261; G01N 2021/3155; G01N 2021/4716; G01N 2021/646; G01N 2021/6484; G01N 2021/95676; G01N 2035/00039; G01N 2035/00108; G01N 2035/00772; G01N 2035/00851; G01N 2035/0401; G01N 21/01; G01N 21/3151; G01N 21/3554; G01N 21/95; G01N 21/9506; G01N 25/66; G01N 25/68; G01N 31/22; G01N 33/04; G01N 33/343; G01N 33/5302; G01N 33/56966; G01N 33/58; G01N 33/6803; G01N 33/6842; G01N 35/00029; G01N 35/00722; G01N 35/00732; G01N 35/02; G01N 35/10; G01N 35/1016; G01N 1/14; G01N 15/1425; G01N 2015/0046; G01N 2015/0073; G01N 2015/1447; G01N 2021/151; G01N 2021/4704; G01N 2021/555; G01N 2021/752; G01N 2021/754; G01N 2021/755; G01N 2021/7783; G01N 2021/8411; G01N 21/293; G01N 21/538; G01N 21/73; G01N 21/77; G01N 21/8507; G01N 21/87; G01N 21/95684; G01N 2291/018; G01N 2291/022; G01N 2291/02466; G01N 2291/02818; G01N 2291/044; G01N 2570/00; G01N 27/44747; G01N 29/024; G01N 29/028; G01N 29/032; G01N 29/44; G01N 30/86; G01N 30/88; G01N 30/95; G01N 33/0029; G01N 33/0057; G01N 33/227; G01N 33/487; G01N 33/4905; G01N 33/492; G01N 33/497; G01N 33/53; G01N 33/54306; G01N 1/18; G01N 1/28; G01N 1/30; G01N 1/40; G01N 15/0227; G01N 15/1431; G01N 2015/0053; G01N 2015/1454; G01N 2021/3181; G01N 2021/3531; G01N 2021/7759; G01N 2021/7766; G01N 2021/8427; G01N 2021/8438; G01N 2021/8488; G01N 2021/8864; G01N 2021/8867; G01N 2021/8967; G01N 2021/945; G01N 2021/9518; G01N 2021/95615; G01N 2035/00455; G01N 2035/00752; G01N 2035/00782; G01N 2035/0463; G01N 2035/1025; G01N 21/29; G01N 21/4788; G01N 21/57; G01N 21/59; G01N 21/6408; G01N 21/643; G01N 21/66; G01N 21/82; G01N 21/9515; G01N 2201/0616; G01N 2201/0642; G01N 2201/102; G01N 2201/1085; G01N 2291/0231; G01N 2291/0258; G01N 2291/104; G01N 2333/9121; G01N 25/62; G01N 27/44721; G01N 2800/52; G01N 29/043; G01N 29/2437; G01N 29/42; G01N 31/224; G01N 33/12; G01N 33/4833; G01N 33/537; G01N 33/542; G01N 33/54353; G01N 33/54393; G01N 33/548; G01N 33/574; G01N 33/6863; G01N 35/1095; G01N 2021/6463; G01N 2291/0256; G01N 29/036; G01N 29/022; G01N 2291/0427; G01N 21/554; G01N 21/211; G01N 2021/7786; G01N 33/5438; G01N 27/026; G01N 21/7746; G01N 2291/0426; G01N 2021/6471; G01N 27/4145; G01N 27/3275; G01N 27/3273; G01N 33/525; G01N 2291/0255; G01N 2021/7776; G01N 27/126; G01N 2291/0423; G01N 33/68; G01N 2201/064; G01N 2201/0696; G01N 27/26; G01N 33/5308; G01N 33/66; G01N 33/48721; G01N 33/552; G01N 21/774; G01N 2291/0422; G01N 33/56983; G01N 2035/00237; G01N 2201/02; G01N 2201/0638; G01N 2201/125; G01N 33/2888; G01N 2291/106; G01N 2021/6434; G01N 27/221; G01N 27/333; G01N 2291/0289; G01N 27/12; G01N 33/52; G01N 33/521; G01N 33/54313; G01N 2035/00534; G01N 27/30; G01N 21/80; G01N 27/414; G01N 27/416; G01N 2035/00059; G01N 2035/1034; G01N 2035/1076; G01N 2201/0446; G01N 27/327; G01N 27/3274; G01N 27/3277; G01N 27/3278; G01N 27/44791; G01N 33/587; G01N 35/109; G01N 2021/7709; G01N 27/305; G01N 31/00; G01N 2021/213; G01N 27/3335; G01N 27/4148; G01N 31/223; G01N 33/532; G01N 23/22; G01N 2500/04; G01N 27/00; G01N 27/3271; G01N 33/483; G01N 33/5091; G01N 33/544; G01N 33/92; G01N 2021/775; G01N 21/47; G01N 23/223; G01N 27/3272; G01N 27/4146; G01N 29/28; G01N 30/02; G01N 30/90; G01N 33/18; G01N 33/6851; G01N 33/6893; G01N 33/94; G01N 35/00; G01N 2021/757; G01N 2021/7723; G01N 2033/0095; G01N 2291/014; G01N 2291/02836; G01N 2333/32; G01N 29/221; G01N 31/225; G01N 33/1886; G01N 33/56938; G01N 33/84; G01N 33/948; G01N 21/766; G01N 2291/023; G01N 2291/0421; G01N 2333/195; G01N 2333/9015; G01N 2333/902; G01N 27/40; G01N 29/07; G01N 29/222; G01N 33/00; G01N 33/48707; G01N 33/569; G01N 33/56916; G01N 33/6896; G01N 19/00; G01N 2001/022; G01N 2015/1488; G01N 2021/6482; G01N 2021/758; G01N 2021/7769; G01N 2021/7779; G01N 2021/9513; G01N 2291/02863; G01N 2291/048; G01N 23/2251; G01N 2333/245; G01N 2333/31; G01N 2333/33; G01N 2333/904; G01N 27/002; G01N 27/423; G01N 2800/28; G01N 2800/324; G01N 29/02; G01N 30/06; G01N 31/221; G01N 33/1813; G01N 33/545; G01N 33/57484; G01N 1/26; G01N 2021/0378; G01N 2021/052; G01N 2021/773; G01N 21/4133; G01N 21/4795; G01N 21/6489; G01N 2201/067; G01N 2291/2696; G01N 23/04; G01N 23/2273; G01N 27/021; G01N 27/125; G01N 27/307; G01N 27/31; G01N 2800/2814; G01N 2800/2821; G01N 29/2462; G01N 29/4418; G01N 33/0054; G01N 33/0073; G01N 33/2847; G01N 33/5082; G01N 33/57415; G01N 33/6845; G01N 33/86; G01N 11/16; G01N 13/02; G01N 15/0612; G01N 15/0637; G01N 2033/4975; G01N 2201/0628; G01N 2201/0683; G01N 2203/0025; G01N 2203/0089; G01N 2203/0094; G01N 2203/0098; G01N 2291/011; G01N 2291/02809; G01N 2291/102; G01N 2291/2634; G01N 2291/265; G01N 2333/4709; G01N 27/128; G01N 27/3276; G01N 27/49; G01N 29/0681; G01N 29/223; G01N 29/24; G01N 29/2406; G01N 3/08; G01N 3/24; G01N 3/42; G01N 31/229; G01N 33/1833; G01N 33/2829; G01N 33/56961; G01N 1/34; G01N 15/10; G01N 15/1031; G01N 2021/212; G01N 2021/258; G01N 21/1702; G01N 21/9505; G01N 2291/0234; G01N 23/043; G01N 27/06; G01N 27/24; G01N 27/27; G01N 27/42; G01N 27/9006; G01N 29/069; G01N 29/11; G01N 29/14; G01N 29/2425; G01N 29/48; G01N 3/04; G01N 33/0034; G01N 33/005; G01N 33/56905; G01N 33/56972; G01N 33/583; G01N 33/6872; G01N 33/80; G01N 35/00009; G01N 37/00; G01N 1/312; G01N 1/405; G01N 15/08; G01N 15/1056; G01N 17/02; G01N 2021/0385; G01N 2021/1704; G01N 2021/4126; G01N 2021/5957; G01N 2021/6495; G01N 2021/7763; G01N 2021/7789; G01N 2021/8861; G01N 2030/125; G01N 21/0332; G01N 21/314; G01N 21/431; G01N 21/6402; G01N 21/958; G01N 2201/084; G01N 2201/104; G01N 2203/006; G01N 2203/0641; G01N 2223/095; G01N 2223/419; G01N 2291/02845; G01N 23/046; G01N 23/083; G01N 23/227; G01N 2333/11; G01N 2333/924; G01N 2333/952; G01N 24/12; G01N 2500/02; G01N 27/07; G01N 27/22; G01N 27/226; G01N 27/227; G01N 27/228; G01N 27/302; G01N 27/36; G01N 27/4074; G01N 2800/164; G01N 2800/7028; G01N 29/22; G01N 29/262; G01N 29/348; G01N 29/4481; G01N 30/12; G01N 30/48; G01N 33/208; G01N 33/5076; G01N 33/523; G01N 33/557; G01N 33/566; G01N 33/57411; G01N 33/6848; G01N 33/6854; G01N 33/9406; G01N 35/00712; G01N 37/005; G01N 9/002; G01N 2009/004; G01N 2013/0266; G01N 2021/0321; G01N 2021/0325; G01N 2021/0328; G01N 2021/1738; G01N 2021/653; G01N 2021/7756; G01N 2021/7796; G01N 2021/825; G01N 2021/8848; G01N 2021/8918; G01N 21/07; G01N 21/3586; G01N 21/81; G01N 21/8901; G01N 21/8914; G01N 21/892; G01N 21/93; G01N 2201/0624; G01N 2201/063; G01N 2201/0691; G01N 2201/0866; G01N 2223/315; G01N 2223/413; G01N 2223/625; G01N 2291/021; G01N 2291/02881; G01N 2291/101; G01N 23/05; G01N 23/18; G01N 23/20008; G01N 23/20075; G01N 23/2258; G01N 2333/315; G01N 2333/47; G01N 2333/59; G01N 2333/726; G01N 2333/96486; G01N 24/10; G01N 2458/00; G01N 2610/00; G01N 27/129; G01N 27/18; G01N 27/301; G01N 27/404; G01N 27/44782; G01N 2800/26; G01N 29/12; G01N 29/2443; G01N 29/26; G01N 29/4454; G01N 31/222; G01N 31/228; G01N 33/20; G01N 33/246; G01N 33/5011; G01N 33/54333; G01N 33/573; G01N 33/57407; G01N 33/57419; G01N 33/57496; G01N 33/581; G01N 33/74; G01N 33/76; G01N 33/9493; G01N 7/00; G01N 7/10; G01N 1/02; G01N 11/00; G01N 13/00; G01N 15/088; G01N 17/006; G01N 2015/0288; G01N 2015/086; G01N 2021/0112; G01N 2021/0396; G01N 2021/214; G01N 2021/5903; G01N 2021/5969; G01N 2021/7726; G01N 2021/7736; G01N 2021/8405; G01N 2021/8528; G01N 2021/869; G01N 2021/8822; G01N 2021/8883; G01N 2030/025; G01N 2030/628; G01N 2030/8417; G01N 2035/00277; G01N 2035/00891; G01N 2035/009; G01N 2035/0091; G01N 2035/102; G01N 2035/1037; G01N 2035/1046; G01N 21/13; G01N 21/3581; G01N 21/61; G01N 21/90; G01N 21/9009; G01N 21/9036; G01N 2201/06193; G01N 2201/1087; G01N 2203/0019; G01N 2223/04; G01N 2223/401; G01N 2223/426; G01N 2223/505; G01N 2223/6466; G01N 2291/02416; G01N 2291/0257; G01N 2291/02827; G01N 2291/02872; G01N 2291/04; G01N 2291/105; G01N 2333/21; G01N 2333/22; G01N 2333/43595; G01N 2333/62; G01N 2333/70553; G01N 2333/775; G01N 2333/942; G01N 2458/15; G01N 27/122; G01N 27/403; G01N 27/4167; G01N 27/44717; G01N 27/4473; G01N 27/44739; G01N 27/453; G01N 27/48; G01N 2800/042; G01N 2800/10; G01N 2800/20; G01N 2800/50; G01N 2800/56; G01N 29/0645; G01N 29/0672; G01N 29/09; G01N 29/226; G01N 29/2412; G01N 29/2468; G01N 29/265; G01N 29/343; G01N 29/4409; G01N 29/4427; G01N 29/46; G01N 3/00; G01N 3/12; G01N 30/24; G01N 30/466; G01N 30/6082; G01N 30/7233; G01N 30/7266; G01N 30/84; G01N 33/0016; G01N 33/0018; G01N 33/0027; G01N 33/0047; G01N 33/0062; G01N 33/1826; G01N 33/1893; G01N 33/205; G01N 33/2835; G01N 33/381; G01N 33/383; G01N 33/442; G01N 33/5035; G01N 33/5064; G01N 33/5306; G01N 33/531; G01N 33/539; G01N 33/5432; G01N 33/54326; G01N 33/5434; G01N 33/57434; G01N 33/6809; G01N 35/00623; G01N 35/1004; G01N 35/1072; G01N 5/02; G01N 5/04; G01N 7/14; G01N 9/00; G01N 9/12

See application file for complete search history.

(56) References Cited

U.S. PATENT DOCUMENTS

| | | |
|---|---|---|
| 2007/0259256 A1 | 11/2007 | Le Canut et al. |
| 2009/0260777 A1 | 10/2009 | Attlesey |
| 2018/0288906 A1 | 10/2018 | Hopton et al. |
| 2020/0001513 A1* | 1/2020 | Jones .................. G01N 21/896 |

(56) References Cited

U.S. PATENT DOCUMENTS

| | | |
|---|---|---|
| 2020/0093026 A1 | 3/2020 | Enright et al. |
| 2021/0102294 A1 | 4/2021 | Miljkovic et al. |
| 2021/0219455 A1 | 7/2021 | Lau |

FOREIGN PATENT DOCUMENTS

| | | | | |
|---|---|---|---|---|
| WO | WO-9915881 A1 * | 4/1999 | ............ | G01N 21/64 |
| WO | WO-2009022649 A1 * | 2/2009 | ............ | G01N 21/94 |
| WO | WO-2015074669 A1 * | 5/2015 | ............ | G01N 21/15 |

OTHER PUBLICATIONS

H. Coles, M. Herrlin, Immersion Cooling of Electronics in DoD Installations, Ernest Orlando Berkeley National Laboratory Report LBNL-100566, May 2016.

Husam Alissa, Mark Shaw, Liquid Immersion Optimized Servers, Presentation at Open Compute Forum San Jose CA Mar. 3-4, 2020.

Flinn, Jason, and Mahadev Satyanarayanan. "Energy-aware adaptation for mobile applications." ACM SIGOPS Operating Systems Review 33.5 (1999): 48-63.

Aguilar-Saborit, Josep, et al. "Dynamic adaptive data structures for monitoring data streams." Data & Knowledge Engineering 66.1 (2008): 92-115.

Masanet, Eric, et al. "Recalibrating global data center energy-use estimates." Science 367.6481 (2020): 984-986.

QTS, "Green Data Centers—Scaling environmental sustainability for business and oncsumers collectively." htttps://www.networkworld.com/article/3569189/green-data-centers-scaling-environmental-sustainability-for-business-and-consumers-collectively.html, Jul. 30, 2020.

\* cited by examiner

REFLECTED ENERGY DETECTION SYSTEM AND METHOD FOR DETECTING OILY RESIDUE IN TWO-PHASE IMMERSION COOLING SYSTEMS

BACKGROUND

Field of the Disclosure

This disclosure relates generally to immersion cooling and, more particularly, to systems for detecting oily residue in two-phase immersion cooling systems for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Embodiments disclosed herein may be directed to systems for detecting oily residue and other contaminants in a two-phase immersion cooling system.

Some immersion cooling systems use two-phase fluids to directly remove heat from components. Heat causes the immersion fluid to change from a first phase (the liquid phase) to a second phase (the vapor phase), wherein the boiling point of the fluid is selected to maintain a component temperature at or below a threshold temperature. In some systems, component surfaces may be etched, have a boiling enhancement coating (BEC) or otherwise be configured to have increased surface area for improved heat transfer to the two-phase fluid.

Embodiments may be directed to a reflected energy monitoring system for detecting residue in an immersion cooling system. Embodiments of a reflected energy monitoring system may comprise an energy source configured to emit energy at an incident angle relative to a surface having a reflectivity, a sensor positioned at a second angle relative to the surface, the sensor configured for detecting an intensity of energy reflected by the surface and outputting a signal corresponding to the intensity of the reflected energy, and a processor coupled to the sensor and configured to receive the signal from the sensor, determine a change in the intensity of the reflected energy based on the signal, and communicate an indication that a residue in the two-phase fluid has exceeded a threshold level based on the change in the intensity of the reflected energy.

In some embodiments, the surface comprises a pair of opposed surfaces, wherein the energy source is configured to emit energy at the incident angle between the pair of opposed surfaces such that the energy is reflected off each surface of the pair of opposed surfaces.

In some embodiments, the surface is part of a heat-generating component. In some embodiments, the surface comprises metal. In some embodiments, the surface comprises a lid of a ball grid array (BGA).

In some embodiments, the energy source is configured to emit light. In some embodiments, the energy source comprises a laser. In some embodiments, the system further comprises a polarizer or other compensator between the light source and the surface, wherein only energy that is colinear with the incident angle is allowed to pass through the compensator.

In some embodiments, a reflected energy monitoring system for detecting residue may form part of a two-phase immersion cooling system. A two-phase immersion cooling system may comprise a tank containing a server or other information handling system immersed in a two-phase fluid.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, component "20-1" refers to an instance of a component, which may be referred to collectively as components "20" and any one of which may be referred to generically as component "20."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices and one or more communications ports for communicating with external devices. The information handling system may also include one or more buses operable to transmit communication between the various hardware components.

Embodiments disclosed herein are described with respect to cooling of heat-generating components on servers installed in tanks containing two-phase immersion fluids. Particular embodiments are best understood by reference to FIGS. 1-5, wherein like numbers are used to indicate like and corresponding parts.

Figure 1:
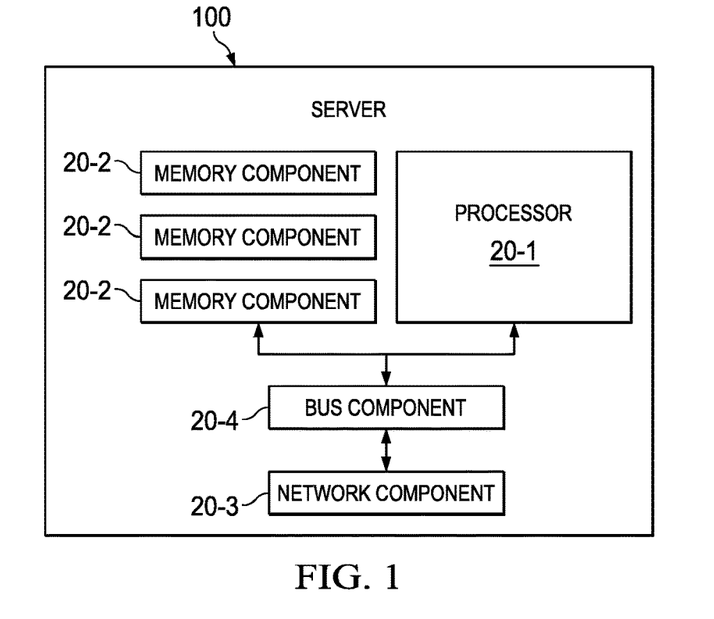
FIG. 1 is a block diagram of selected components of an information handling system.

Referring to FIG. 1, an information handling system such as information handling system 100 may include processor components 20-1, memory components 20-2 and network components 20-3, along with bus components 20-4 or other systems for connecting components 20 on information handling system 100.

Processor components 20-1 may comprise systems, devices, or apparatuses operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor components 20-1 may interpret and execute program instructions and process data stored locally (e.g., in memory subsystem). In the same or alternative embodiments, processor components 20-1 may interpret and execute program instructions and process data stored remotely (e.g., in a network storage resource).

Memory components 20-2 may comprise systems, devices, or apparatuses operable to retain and retrieve program instructions and data for a period of time (e.g., computer-readable media). Memory components 20-2 may comprise random access memory (RAM), electrically erasable programmable read-only memory (EEPROM), a PCM-CIA card, flash memory, magnetic storage, opto-magnetic storage, and/or a suitable selection and/or array of volatile or non-volatile memory that retains data after power to its associated information handling system is powered down.

Network components 20-3 may comprise systems, devices, or apparatuses operable to serve as an interface between an information handling system and a network (not shown). Network components 20-3 may enable information handling systems 100 to communicate over a network using a suitable transmission protocol or standard. In some embodiments, a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to a network interface or various network components 20-3 associated therewith may be implemented using hardware, software, or any combination thereof.

Bus components 20-4 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Components 20 receive power and communicate with other components 20 on information handling system 100 through electronic connections. As power and communication enters information handling system 100, the connections allow information handling system 100 to execute instructions and process information. Examples of electronic connections include permanent connections such as ball grid arrays (BGAs) and other soldered connections and non-permanent connections such as pin connectors, which allow for easier installation and removal of components 20. Each connection provides a path for power and/or communication between components 20 on information handling system 100. Each connection may involve one or more contact points. In some information handling systems, contact points may be formed at least partially with gold due to the low current resistance of gold and formed at least partially with nickel or some other material to protect the gold or provide a better base for adhering the gold to the component, PCB, etc. Information handling systems 100 can have 10,000 or more contact points including contact points found in Dual In-Line Memory Modules (DIMMs), peripheral component interface express (PCIe) cards, central processing units (CPUs) and other components.

Two-Phase Immersion Cooling System

As components 20 on information handling system 100 execute instructions and process information, they generate heat. One approach to cool components 20 is a two-phase immersion cooling system. In two-phase immersion cooling, one or more information handling systems 100 are immersed in a non-conductive fluid with a low boiling point. Novec 649 is an example of a two-phase fluid. Novec 649 is non-conductive and has a boiling point of 49 C. Information handling systems 100 may be immersed in Novec 649 and the Novec 649 may directly remove heat from components 20.

Figure 2:
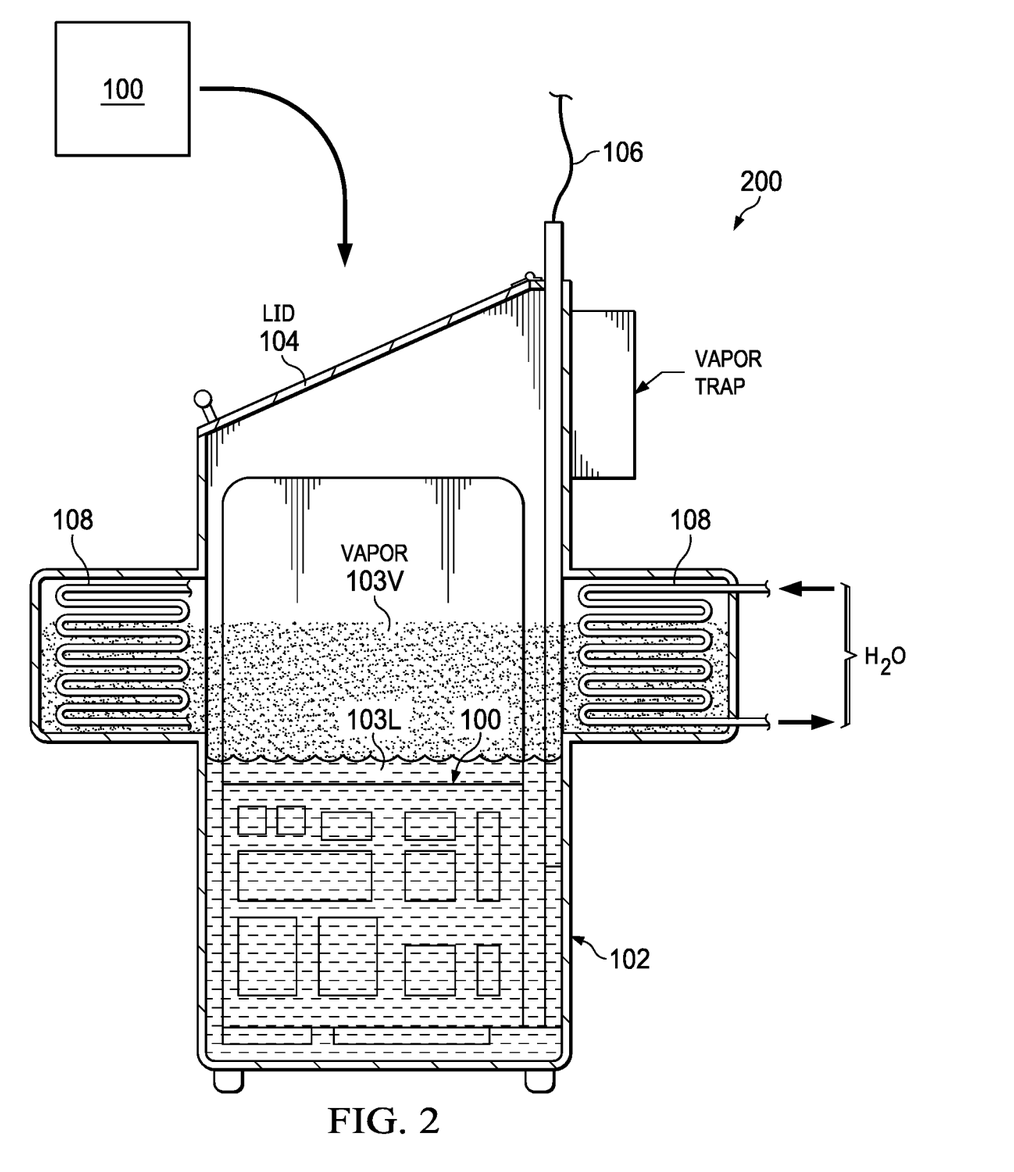
FIG. 2 is a side cutaway view of a two-phase immersion cooling system with the information handling system of FIG. 1 installed therein.

FIG. 2 is side cutaway view of a two-phase immersion cooling system with information handling system 100 installed therein.

As shown in FIG. 2, a two-phase immersion cooling system 200 may include, but is not limited to, tank 102 containing fluid 103 with lid 104, cables 106, heat exchanger 108 and vapor trap 110.

Tank 102 contains two-phase fluid 103 capable of existing in both a liquid phase (denoted as fluid 103L) and as a vapor (denoted as fluid 103V), wherein "fluid 103" comprises a non-conductive fluid with a low boiling point and includes fluid 103L and fluid 103V. Lid 104 allows for installation, removal and servicing of one or more information handling systems 100 in tank 102. When closed, lid 104 seals tank 102 to prevent contaminants from entering fluid 103.

Cables 106 provide power and communication functionality to the components 20 on information handling system 100.

Heat exchanger 108 is configured to remove heat from fluid 103. Contact by fluid 103V with heat exchanger 108 results in condensation, which changes fluid 103V to fluid 103L.

Vapor trap 110 may remove water vapor from tank 102 to prevent contamination of fluid 103.

Components 20 use the power to process instructions and, in the process, generate heat. Using fluid 103 with a low boiling point is effective in removing heat from components 20 and information handling system 100. If components 20 generate enough heat, localized boiling of fluid 103L may occur near a component surface. As fluid 103L boils, bubbles of fluid 103V form near component 20 and rise to the surface, which promotes fluid flow past component 20. Since tank 102 is sealed, fluid 103V may exit fluid 103L but fluid 103V is retained in tank 102. For some heat generating components 20, a component surface may be etched or treated with a boiling enhancement coating (BEC) (not shown) to increase the surface area for increased boiling.

Residues—Overview

Two-phase immersion cooling of components 20 is susceptible to problems if contaminants are present in fluid 103. Contaminants may be introduced into fluid 103 when components 20 or information handling systems 100 are added, serviced or replaced. For example, liquid water can solvate contaminates and become corrosive. Contaminants may collect in certain areas of tank 102 relative to information handling systems 100 due to the two-phase immersion cooling process. For example, when fluid 103V condenses into fluid 103L, fluid 103L in some areas of tank 102 may be highly concentrated or pure, causing plasticizers and other contaminants to leach from printed circuit boards (PCBs), cables, plastic parts and other components of information handling system 100 with negative pressures or diffusion through elastomers. Also, when fluid 103L boils to change into fluid 103V, contaminants in the form of residues are distilled out of fluid 103L at the point where the boiling occurs.

Effects of Residues

Residues caused by distilling contaminants out of fluid 103L may negatively affect heat transfer from components 20. For example, residues may be deposited on a component surface, which can decrease the rate at which heat can be transferred out of the component 20. For components 20 with etched component surfaces or BECs, covering the component surface or filling in the component surface texture with residues will reduce the total surface area of the component surface, further reducing the rate at which heat can be transferred away from component 20. Residues can also lead to corrosion and metal migration, which may result in problems such as fouled contact points and current leakage paths or some other interference between components 20. For example, residues may be deposited on contact points between components 20 and connectors of printed circuit boards (PCB) or other connectors of information handling system 100, providing a catalyst for corrosion.

Referring to connections with gold and nickel plating with a copper base metal, the plating has tiny pores that expose the copper base metal to contaminants that corrode the copper. As corrosion advances, the nickel or copper material may corrode through the gold material such that the contact point includes gold, copper and/or nickel. In doing so, the current resistance at the contact point (also referred to as contact resistance) may increase, causing a decrease in performance capability of component 20 up to failure of the component. Corrosion can lead to metal migration, in which metal ions are displaced from an initial location and moved elsewhere. For example, corrosion of ball grid array (BGA) solder balls may displace lead, tin or silver material forming a solder ball. The metal ions can form dendrites or other structures that can result in short circuits or interferences between components 20. Furthermore, a negative effect associated with one contaminant may combine with negative effects of other contaminants, leading to a cumulative increase in residue or causing a cascading failure.

An approach to preventing corrosion is to use materials that do not form contaminants. For example, some materials have been identified that are less likely to leach contaminants when in contact with Novec 649. However, not all materials can be replaced. As a result, contaminants are commonly found in fluids 103 when using two-phase immersion cooling.

Another approach to preventing corrosion is to remove the contaminants. Filters are used in an effort to remove contaminants. Activated carbon filters can remove plasticizers that cause oily residues. However, filters might not remove all contaminants and filter capacity can be exceeded if new information handling systems are added to the tank, an information handling system is replaced or parts containing plastic are added or replaced. Consequences of exceeding the filter capacity may require a technician having to dis-assemble and clean the oily residue out of every ball grid array (BGA), DIMM, CPU, GPU etc., in a tank of information handling systems 100, or risk permanently damaging BGAs and contact points in an entire tank of information handling systems 100.

Embodiments disclosed herein may include systems and methods for early detection of oily residue formation as an indicator of contaminants and for signaling to allow for corrective actions before permanent damage to information handling systems 120 or components on information handling systems 120 can occur.

Measuring Changes in Reflected Energy as an Indicator of the Presence of a Residue To overcome these problems and others, embodiments may include a reflected energy monitoring system to detect contaminants based on the presence of residues in two-phase fluids based on changes in intensity of energy.

In some embodiments, energy reflected off a reflective surface is measured and analyzed. A change in intensity of the energy may be due to a change in an index of refraction of energy, which may indicate the presence of oily residue on the reflective surface. As the change in reflected energy intensity increases, embodiments may determine this as an indicator that enough residue is present in fluid 103 to cause corrosion, decrease heat transfer rate or result in other unwanted effects.

Reflected Energy Monitoring Systems—Overview

Figure 3:
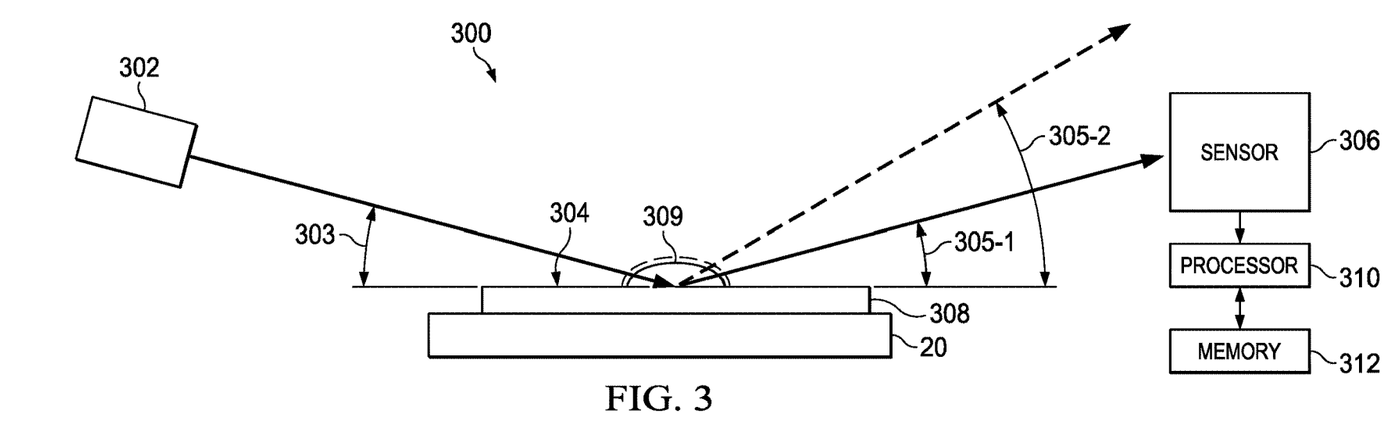
FIG. 3 is a side view of one embodiment of a reflective energy monitoring system for detecting residue in fluid contained in the two-phase immersion cooling system of FIG. 2.
Figure 4:
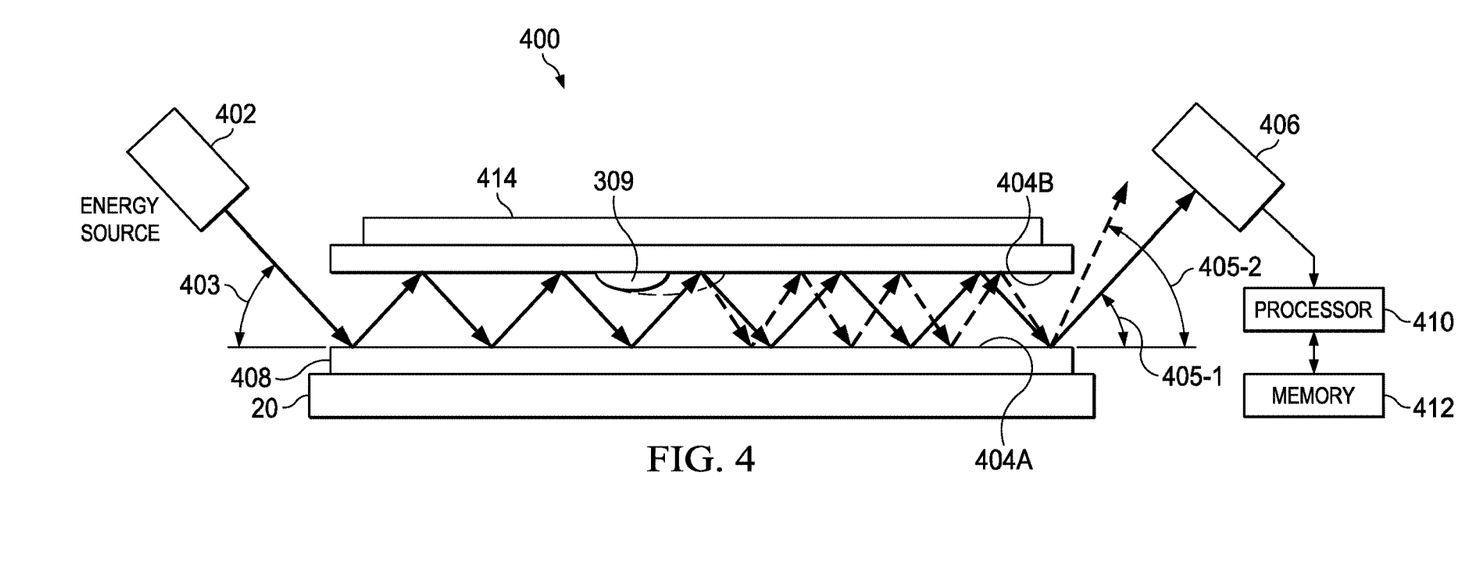
FIG. 4 is a side view of one embodiment of a multiple reflection reflective energy monitoring system for detecting residue in fluid contained in the two-phase immersion cooling system of FIG. 2.

Referring to one or more of FIGS. 3 and 4, embodiments of a reflected energy monitoring system may monitor reflected energy to detect the presence of residue. The energy may be emitted by a single source, such as light emitted by a laser. The energy may be in the visible spectrum or an invisible spectrum. In some embodiments, a reflected energy monitoring system may be configured to detect energy reflected off a single reflective surface. In other embodiments, a reflected energy monitoring system may be configured with multiple reflective surfaces to allow multiple reflections of energy before being sensed. To increase the likelihood that a reflected energy monitoring system can detect residue early, embodiments may be positioned near a heat source or include a heating element. The heat source may be selected due to a high rate of heat generation or a heating element may be configured to generate more heat than any heat generating component to maximize the rate at which fluid 103 boils in the vicinity of the reflected energy monitoring system.

Reflected Energy Monitoring Systems—Single Reflection

Referring to FIG. 3, embodiments of a reflected energy monitoring system may be configured to detect energy intensity reflected once off a single reflective surface. Energy emitted by energy source 302 is directed at an incident angle 303 to reflective surface 304, wherein energy contacting reflective surface 304 is expected to reflect at a target angle 305-1 for detection by sensor 306.

Energy source 302 is configured to emit energy at an incident angle 303 in the direction of reflective surface 304. In some embodiments, energy source 302 may be oriented to emit a beam of energy at an incident angle 303 to ensure substantially all energy is emitted in the direction of reflective surface 304. In some embodiments, a polarizer or other compensator (not shown) may be positioned between energy source 302 and reflective surface 304 such that only energy emitted by energy source 302 that is colinear with the incident angle 303 can pass through the compensator. In some embodiments, energy source 302 may emit a beam of energy at an incident angle 303 nearly parallel with reflective surface 304. This incident angle 303 may be referred to as a glancing angle.

Reflective surface 304 is configured such that at least a portion of the energy emitted by energy source 302 reflects off reflective surface 304 at a target reflected angle 305-1. In some embodiments, surface 304 may be metal with a corresponding reflectivity or coated with a material to ensure energy can be reflected off reflective surface 304 at the target reflected angle 305-1. In some embodiments, surface 304 comprises a surface of an existing component 20. As depicted in FIG. 3, surface 304 may comprise lid 308 of a ball grid array (BGA) component 20. Component 20 may generate sufficient heat to cause boiling of fluid 103 near surface 304, which may increase the likelihood that residue 309 is deposited on surface 304.

The target reflected angle 305-1 may be based on ensuring substantially all energy emitted by energy source 302 is reflected off reflective surface 304 and contacts sensor 306.

Intensity sensor 306 may be positioned opposed to energy source 302 for sensing the intensity of energy reflected off reflective surface 304. Intensity sensor 306 is configured to detect small changes in the intensity of energy reflected off reflective surface 304. In some embodiments, intensity sensor 306 is oriented at an angle to detect only energy reflected off reflective surface 304 at the target reflected angle 305-1. In some embodiments, intensity sensor 306 comprises an array of sensing elements and intensity sensor 306 comprises a processor configured to determine an intensity of energy sensed by one or more sensing elements.

Residues Change the Amount of Energy Reflected onto a Sensor

When residues are not present, the portion of reflected energy is expected to have an intensity proportional to the intensity of the energy emitted by energy source. For example, as depicted in FIG. 3, when residue 309 is not present, the energy emitted by energy source 302 reflects off reflective surface 304 at target angle 305-1 such that the reflected energy is sensed by sensor 306. However, if residue 309 is present, energy may be reflected at an actual reflected angle 305-2, changing the intensity of the portion of reflected energy sensed by intensity sensor 306. A residue 309 may increase or decrease the actual reflected angle 305-2. As depicted in FIG. 3, residue 309 may increase the actual reflected angle 305-2. A residue 309 may decrease the reflectivity of reflective surface 304, causing a decrease in the intensity of energy sensed by intensity sensor 306 due to diffusing the energy. A residue 309 may increase the reflectivity of reflective surface 304, causing an increase in the intensity of energy sensed by intensity sensor 306.

Reflected Energy Monitoring Systems—Multiple Reflections

In some immersion cooling systems, embodiments of a single reflection reflected energy monitoring system 300 may be undesirable or impractical. For example, a small incident angle may be desirable to ensure reflected energy monitoring system 300 can detect residue 309 anywhere on reflective surface 304, but a lack of space may limit where energy source 302 is located or at what incident angle energy source 302 can emit energy. Some embodiments of a reflected energy monitoring system may be configured to allow energy source to emit energy at a higher incident angle and measure energy reflected off multiple reflective surfaces to detect residues.

FIG. 4 depicts one embodiment of a reflected energy monitoring system 400 utilizing an energy source 402 oriented at an incident angle configured to cause multiple reflections of energy to detect residue.

Energy source 402 may be configured to emit energy at an incident angle 403 in the direction of a first reflective surface 404A of a pair of reflective surfaces 404A, 404B. In some embodiments, energy source 402 may be oriented to emit a beam of energy at incident angle 403 to ensure substantially all energy is emitted in the direction of first reflective surface 404A. In some embodiments, a polarizer or other compensator (not shown) may be positioned between energy source 402 and first reflective surface 404A such that only energy emitted by energy source 402 that is colinear with incident angle 403 passes through the compensator. In some embodiments, energy source 402 may emit a beam of energy at a higher incident angle 403 relative to first reflective surface 404A to ensure energy is likely to contact residue 309 at more locations on reflective surface 404A.

First reflective surface 404A and second reflective surface 404B are configured to reflect energy. In some embodiments, first reflective surface 404A and second reflective surface 404B are formed on metal plates 408. In some embodiments, metal plates 408 may form part of a component 20, such as a BGA lid on which first surface 404A is formed. In other embodiments, metal plates 408 may be formed as independent structures, such as metal plate 408 on which second reflective surface 404B is formed. In some embodiments, plates 408 may be coated with a material to ensure energy is reflected off first reflective surface 404A and second reflective surface 404B. Second reflective surface 404B formed as a reflective surface may be positioned opposite first reflective surface 404A, wherein energy reflected off first reflective surface 404A is subsequently be reflected off second reflective surface 404B. The separation between first reflective surface 404A and second reflective surface 404B and the reflectivity of first reflective surface 404A and second reflective surface 404B may be configured to ensure energy emitted by energy source 402 is reflected at the target reflected angle 405-1.

Intensity sensor 406 may be positioned opposed to energy source 302 for sensing the intensity of energy reflected off of reflective surfaces 404A, 404B. In some embodiments, intensity sensor 306 is oriented to detect only energy reflected off of reflective surfaces 404A, 404B at target reflected angle 405-1. In some embodiments, intensity sensor 406 comprises an array of sensing elements and intensity sensor 306 comprises a processor configured to determine an intensity of energy sensed by one or more sensing elements.
Residues Change the Amount of Energy Reflected onto a Sensor Similar to the discussion above with respect to single reflections of energy, the portion of reflected energy detected by sensor 406 is expected to have an intensity proportional to the intensity of the energy emitted by energy source 402. For example, as depicted in FIG. 4, when residue 309 is not present, the energy emitted by energy source 402 reflects off of reflective surfaces 404A, 404B multiple times at target reflected angle 405-1 such that the reflected energy is sensed by sensor 406. However, if residue 309 is present, energy may be reflected at an actual reflected angle 405-2 that is different from the target reflected angle 405-1, changing the intensity of the portion of reflected energy sensed by intensity sensor 406. A residue 309 may increase or decrease the actual reflected angle 405-2. As depicted in FIG. 4, residue 309 may increase the actual reflected angle 405-2. A residue 309 may decrease the reflectivity of reflective surface 404A or 404B, causing a decrease in the intensity of energy sensed by intensity sensor 406 due to diffusing the energy. A residue 309 may increase the reflectivity of reflective surface 404A or 404B, causing an increase in the intensity of energy sensed by intensity sensor 406. For example, a component 20 may have a surface that is etched or treated with a boiling enhancement coating (BEC) to facilitate boiling. Residue 309 may fill in an etched surface such that more energy is reflected or residue 309 may have a different reflectivity than a BEC.

Referring to FIG. 4, in some embodiments, a heat source 414 may be positioned near or in contact with plate 408 forming second reflective surface 404B. Heat source 414 may generate heat to cause boiling in fluid 103, wherein the increase in boiling may enhance residue formation 309 on first reflective surface 404A or second reflective surface 404B.

Embodiments of reflected energy monitoring systems 300 and 400 may be integrated on an existing printed circuit board (PCB) in information handling system 100. In some embodiments, reflected energy monitoring systems 300 or 400 may be integrated on a BGA-like PCB substrate such as depicted in FIG. 4 or mounted on a PCIe card (not shown) having other functionality. Reflected energy monitoring systems 300 and 400 may be positioned near a GPU or other high heat generating component 20 to maximize the likelihood that residues are distilled out of fluid 103 can be detected by reflected energy monitoring system 300 or 400.
Method of Detecting Contaminants Based on Reflected Energy for Detecting Residues Referring to FIG. 5, a method for detecting contaminants based on reflecting energy to detect residue in an immersion cooling system may start at step 502, with an energy source (e.g., energy source 302 or 304) emitting energy at an incident angle (e.g., incident angle 303 or 403) at a surface (e.g., surface 304 or 404A).

Figure 5:
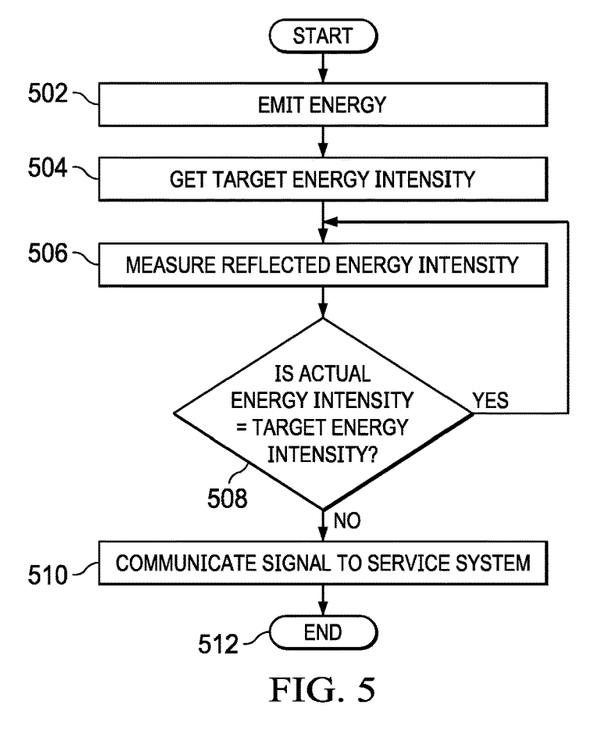
FIG. 5 is a flow diagram depicting a method for determining if a residue is present on a surface in the two-phase immersion cooling system of FIG. 2.

At step 504, a target reflected energy intensity may be determined. In some embodiments, determining a target reflected energy intensity may comprise a processor (e.g., processor 310 or 410) retrieving the target reflected energy intensity from a memory (e.g., memory 312 or 412). In some embodiments, determining a target reflected energy intensity may comprise directly measuring the energy output by the energy source and predicting the target reflected energy intensity based on a reflectivity of the surface.

At step 506, the intensity of the reflected energy may be measured by a sensor (e.g., sensor 306 or 406) and communicated to the processor.

At step 508, the actual reflected energy intensity measured by the sensor may be compared with the target reflected energy intensity to determine if the actual reflected energy intensity is equal to the target reflected energy intensity. In some embodiments, comparing the actual reflected energy intensity with the target reflected energy intensity comprises determining if the actual reflected energy intensity is equal to or greater than a minimum reflected energy threshold. In some embodiments, comparing the actual reflected energy intensity with the target reflected energy intensity comprises determining if the difference between the actual reflected energy intensity and the target reflected energy level is less than a difference threshold level. In some embodiments, the actual reflected energy intensity is calculated as a percentage of the target reflected energy intensity, wherein comparing the actual reflected energy intensity with the target reflected energy intensity comprises determining if a percentage change in the actual reflected energy intensity is equal to or greater than a percentage threshold level.

At step 508, if the actual reflected energy intensity is equal to the target reflected energy intensity or is greater than a minimum reflected energy threshold, or the difference between the actual reflected energy intensity and the target reflected energy level is less than a difference threshold level, embodiments may determine there is no residue on the surface or determine that the amount of residue on the surface is less than a threshold residue level and may continue performing steps 506 and 508.

At step 508, if the actual reflected energy intensity is less than the target reflected energy intensity or is less than a minimum reflected energy threshold, or the difference between the actual reflected energy intensity and the target reflected energy level is equal to or greater than a difference threshold level, embodiments may determine there is residue on the surface or determine that the amount of residue on the surface is greater than a threshold residue level. In some embodiments, the actual reflected energy intensity may indicate the presence of metal migration. For example, energy may have a continuous intensity over a range of angles when reflected off a component surface in the absence of metal migration. Metal migration may show up as dendrites or other structures on a component surface such that portions of the energy are diffracted at discontinuous angles. Embodiments may determine the actual reflected energy intensity over a range of angles, wherein a sharp increase or decrease in reflected energy within the range of angles may indicate a dendrite or other structure formed by metal migration.

At step 510, in response to determining a residue is present on a surface, embodiments may determine there are contaminants present in fluid 103 and may communicate a signal to a service system to allow for corrective measures before the level of residue or corrosion damages a component 20 on information handling system 100 or interferes with operation of a component 20. The signal may be transmitted to a separate information handling system for display to a user. Some embodiments may be configured to communicate a basic signal that indicates residue or corrosion is present. Some embodiments may be configured to communicate a signal that indicates a filter must be changed, that fluid 103 should be replaced, that a component 20 or information handling system 100 should be replaced or will need to be replaced soon, or some other corrective measure less than a total replacement of all information handling systems 100 in tank 102. A signal may include one or more measurements to allow a processor to determine an amount of residue present in tank 102.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A system for detecting residue in an immersion cooling system, comprising:
    an energy source configured to emit energy at an incident angle relative to a reflective surface of a pair of opposed reflective surfaces, wherein the pair of opposed reflective surfaces are separated by a distance, wherein the incident angle is configured such that the energy is reflected off each reflective surface of the pair of opposed reflective surfaces;
    a sensor positioned at a second angle relative to at least one reflective surface of the pair of opposed reflective surfaces, the sensor configured for detecting an intensity of energy reflected off the at least one reflective surface of the pair of opposed reflective surfaces and outputting a signal corresponding to the intensity of the reflected energy; and
    a processor coupled to the sensor and configured to:
        receive the signal from the sensor;
        determine the intensity of the reflected energy based on the signal;
        determine a residue is present on the at least one reflective surface of the pair of opposed reflective surfaces based on a difference between the intensity of the reflected energy and the target intensity of the reflected energy exceeding a difference threshold level; and
        communicate an indication that the residue is present in the immersion cooling system.

2. The system of claim 1, wherein the at least one reflective surface of the pair of reflective surfaces comprises metal.

3. The system of claim 1, further comprising a heat source for causing boiling at the at least one reflective surface of the pair of opposed reflective surfaces.

4. The system of claim 3, wherein the heat source comprises a heat-generating component.

5. The system of claim 4, wherein the heat-generating component comprises a ball grid array (BGA).

6. The system of claim 5, wherein the at least one reflective surface of the pair of opposed reflective surfaces comprises a lid of the ball grid array (BGA).

7. The system of claim 1, wherein the energy source is configured to emit light.

8. The system of claim 7, further comprising a polarizer between the light source and the at least one reflective surface of the pair of opposed reflective surfaces.

9. The system of claim 7, wherein the energy source comprises a laser.

10. The system of claim 1, wherein:
    the sensor is configured to detect the intensity of energy reflected off the at least one reflective surface of the pair of opposed reflective surfaces over a range of angles and output a signal corresponding to the intensity of the reflected energy at a plurality of angles within the range of angles; and
    the processor is configured to determine the presence of metal migration based on a discontinuity in the reflected energy intensity at one or more angles of the plurality of angles.

11. A method for detecting residue in a two-phase immersion cooling system, comprising:
    emitting, by an energy source, energy at an incident angle relative to a reflective surface of a pair of opposed reflective surfaces, wherein the pair of opposed reflective surfaces are separated by a distance, wherein the incident angle is configured such that the energy is reflected off each reflective surface of the pair of opposed reflective surfaces;
    detecting, by an intensity sensor, an intensity of energy reflected off at least one reflective surface of the pair of opposed reflective surfaces and outputting a signal corresponding to the intensity of the reflected energy, the sensor positioned at a second angle relative to the at least one reflective surface of the pair of opposed reflective surfaces;
    receiving, by a processor, the signal from the sensor;
    determining, by the processor, the intensity of the reflected energy based on the signal;
    determining a residue is present on the at least one reflective surface of the pair of opposed reflective surfaces based on a difference between the intensity of the reflected energy and the target intensity of the reflected energy exceeding a difference threshold level; and
    communicating, by the processor, an indication that the residue is present in the two-phase immersion cooling system.

12. The method of claim 11, wherein determining a change in intensity of the reflected energy comprises determining one of a decrease in the intensity of the reflected energy, an increase in the intensity of the reflected energy, a diffusion in the reflected energy or a focusing of the reflected energy.

13. The method of claim 11, further comprising adding heat to the fluid to causing boiling at the at least one reflective surface of the pair of opposed reflective surfaces.

14. The method of claim 13, wherein adding heat comprises positioning the at least one reflective surface of the pair of opposed reflective surfaces near a heat-generating component.

15. The method of claim 13, wherein adding heat comprises positioning the at least one reflective surface of the pair of opposed reflective surfaces near a ball grid array (BGA).

16. The method of claim 15, wherein emitting energy at an incident angle relative to the at least one reflective surface of the pair of opposed reflective surfaces comprises emitting energy at an incident angle relative to a lid of the ball grid array (BGA).

17. The method of claim 11, wherein determining that a residue is present on the at least one reflective surface of the pair of opposed reflective surfaces based on the intensity of the reflected energy comprises determining that a change in the intensity of the reflected energy exceeds a reflected energy threshold level.

18. The method of claim 11, wherein:
the sensor is configured to detect the intensity of energy reflected off the at least one reflective surface of the pair of opposed reflective surfaces over a range of angles and output a signal corresponding to the intensity of the reflected energy at a plurality of angles within the range of angles; and
the processor is configured to determine the presence of metal migration based on a discontinuity in the reflected energy intensity at one or more angles of the plurality of angles.

\* \* \* \* \*